US012772408B2

(12) United States Patent
Heistand, II et al.

(10) Patent No.: US 12,772,408 B2
(45) Date of Patent: Oct. 20, 2026

(54) SERVER SYSTEM DRIVE MOUNTING SYSTEM INCLUDING A RISER RETENTION BRACKET

(71) Applicant: Dell Products L.P., Round Rock, TX (US)

(72) Inventors: Raymond DeWine Heistand, II, Round Rock, TX (US); James Utz, Georgetown, TX (US)

(73) Assignee: Dell Products L.P., Round Rock, TX (US)

( * ) Notice: Subject to any disclaimer, the term of this patent is extended or adjusted under 35 U.S.C. 154(b) by 252 days.

(21) Appl. No.: 18/517,972

(22) Filed: Nov. 22, 2023

(65) Prior Publication Data

US 2025/0169020 A1 May 22, 2025

(51) Int. Cl.
*H05K 7/14* (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS 5,861,821 A * 1/1999 Kato ..................... G06F 3/0219 341/23
9,122,458 B2 * 9/2015 Yu ........................... G06F 1/185
11,150,705 B1 * 10/2021 Hsieh .................... H05K 7/1487
2023/0051799 A1 * 2/2023 Tsorng ................. H05K 7/1405
2023/0422422 A1 * 12/2023 Huang ................. H05K 7/1487

* cited by examiner

*Primary Examiner* — James Wu
*Assistant Examiner* — Christopher L Augustin
(74) *Attorney, Agent, or Firm* — Terrile, Cannatti & Chambers, LLP; Stephen A. Terrile

(57) ABSTRACT

A drive mounting system. The drive mounting system includes a rotating lever component; and, a riser retention bracket, the riser retention bracket comprising: a lateral riser retention bracket component; the lateral bracket component defining a plurality of riser cage stand off apertures, the plurality of riser cage stand off apertures being positioned to mate with respective riser cage stand offs of a plurality of riser cage stand offs; wherein, the plurality of riser cage stand off apertures provide an ability to laterally move the plurality of riser cage stand offs while enabling the riser cage stand offs to couple with the riser retention bracket.

15 Claims, 12 Drawing Sheets

SERVER SYSTEM DRIVE MOUNTING SYSTEM INCLUDING A RISER RETENTION BRACKET

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a drive mounting system which provides an ability to laterally move risers sideways (e.g., left or right) and still have the risers couple with (i.e., grasp) the bracket itself.

In one embodiment, the invention relates to a riser retention bracket, comprising: a lateral riser retention bracket component; the lateral bracket component defining a plurality of riser cage stand off apertures, the plurality of riser cage stand off apertures being positioned to mate with respective riser cage stand offs of a plurality of riser cage stand offs; wherein, the plurality of riser cage stand off apertures provide an ability to laterally move the plurality of riser cage stand offs while enabling the riser cage stand offs to couple with the riser retention bracket.

In another embodiment, the invention relates to a drive mounting system comprising a rotating lever component; and, a riser retention bracket, the riser retention bracket comprising: a lateral riser retention bracket component; the lateral bracket component defining a plurality of riser cage stand off apertures, the plurality of riser cage stand off apertures being positioned to mate with respective riser cage stand offs of a plurality of riser cage stand offs; wherein, the plurality of riser cage stand off apertures provide an ability to laterally move the plurality of riser cage stand offs while enabling the riser cage stand offs to couple with the riser retention bracket.

In another embodiment, the invention relates to a system comprising: a processor; a data bus coupled to the processor; and, a drive mounting system comprising a rotating lever component; and, a riser retention bracket, the riser retention bracket comprising: a lateral riser retention bracket component; the lateral bracket component defining a plurality of riser cage stand off apertures, the plurality of riser cage stand off apertures being positioned to mate with respective riser cage stand offs of a plurality of riser cage stand offs; wherein, the plurality of riser cage stand off apertures provide an ability to laterally move the plurality of riser cage stand offs while enabling the riser cage stand offs to couple with the riser retention bracket.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
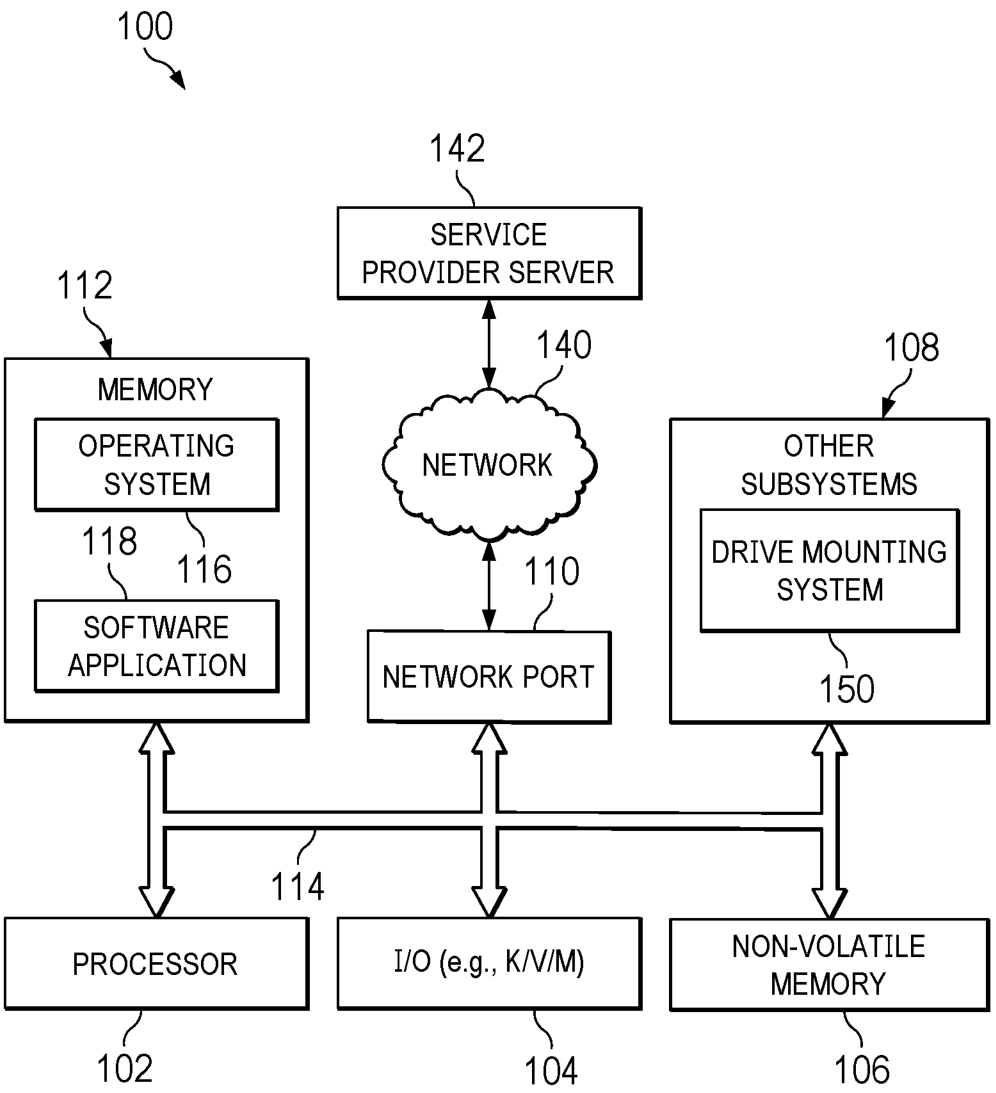
FIG. 1 shows a general illustration of components of an information handling system as implemented in the system and method of the present invention.

Various aspects of the disclosure include an appreciation that it is known to provide information handling systems with devices which conform to specifications defined by an open compute project (OCP) foundation. Various aspects of the disclosure include an appreciation that the open compute project (OCP) foundation has also defined a plurality of additional specifications some of which are within a datacenter modular hardware system (DC-MHS) family of specifications. Various aspects of the present disclosure include an appreciation that one such additional specification is the partial width, density optimized host processor module (HPM) form factor (referred to as an M-DNO form factor) base specification.

Various aspects of the disclosure include an appreciation that it is known to use posts to retain risers in certain types of bay cages. Various aspects of the disclosure include an appreciation that due to the close placement of the riser connectors and high-speed connectors defined certain riser card specifications (such as the HPM M-DNO specification) as well as the pre-defined location for riser cage retention features, there is insufficient space for a post to retain risers. Various aspects of the disclosure include an appreciation that riser retention is desirable to ensure that a riser board card edge is fully engaged with a riser connector on the planar and remains engaged during shock events, such as during shipping.

A system and method are disclosed for providing riser card retention system which allows card retention features without the need for a post to retain the card. In certain embodiments, the riser card retention system includes a riser retention bracket which allows retention of a riser cage within constraints of certain riser card specifications (such as the HPM M-DNO specification). In certain embodiments, the bracket mounts directly to the host processor module using standoffs. In certain embodiments, the riser card retention system includes a rotating lever which interacts with the bracket. When the rotating lever is in a closed orientation, such a riser card retention system ensures the cage edge is fully inserted into the riser connector and provides retention during shock events.

In certain embodiments, to prevent the board card edge of the riser from disengaging from the riser connector during shock events, a lever hook is positioned very close (i.e., within 5 cm (+/−20%)) to the bottom, center of the pivot. The other end of the lever includes a tab which is very near (i.e., within 2 cm (+/−20%)) an inside surface of a top cover of an information handling system chassis. This tab helps maintain the closed position of the lever when the top cover of the information handling system chassis is present.

Such a riser retention bracket advantageously allows a plurality of mounting points for rear drive bays or similar rear accessible modules along with allowing rear blank bay areas. In certain embodiments, the bracket of the riser retention system is mounted directly to the planar of the server type information handling system for securing devices within device bays such as PCIe riser cages and externally mounted drive bays or other rear accessible modules with minimal impact on the board area of the planar board. Such a riser retention system enhances design flexibly by providing latching or mounting points in areas of the server type information handling system without compromising design or integrity of the server type information handling system.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include a drive mounting system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the drive mounting system 150 includes a riser card retention system which allows card retention features without the need for a post to retain the card. In certain embodiments, the riser card retention system includes a riser retention bracket which allows retention of a riser cage within constraints of certain riser card specifications (such as the HPM M-DNO specification). In certain embodiments, the bracket mounts directly to the host processor module using standoffs. In certain embodiments, the riser card retention system includes a rotating lever which interacts with the bracket. When the rotating lever is in a closed orientation, such a riser card retention system ensures the cage edge is fully inserted into the riser connector and provides retention during shock events.

In certain embodiments, to prevent the board card edge of the riser from disengaging from the riser connector during shock events, a lever hook is positioned very close (i.e., within 5 cm (+/−20%)) to the bottom, center of the pivot. The other end of the lever includes a tab which is very near (i.e., within 2 cm (+/−20%)) an inside surface of a top cover of an information handling system chassis. This tab helps maintain the closed position of the lever when the top cover of the information handling system chassis is present.

Such a riser retention bracket advantageously allows a plurality of mounting points for rear drive bays or similar rear accessible modules along with allowing rear blank bay areas. In certain embodiments, the bracket of the riser retention system is mounted directly to the planar of the server type information handling system for securing devices within device bays such as PCIe riser cages and externally mounted drive bays or other rear accessible modules with minimal impact on the board area of the planar board. Such a riser retention system enhances design flexibly by providing latching or mounting points in areas of the server type information handling system without compromising design or integrity of the server type information handling system.

Figure 2:
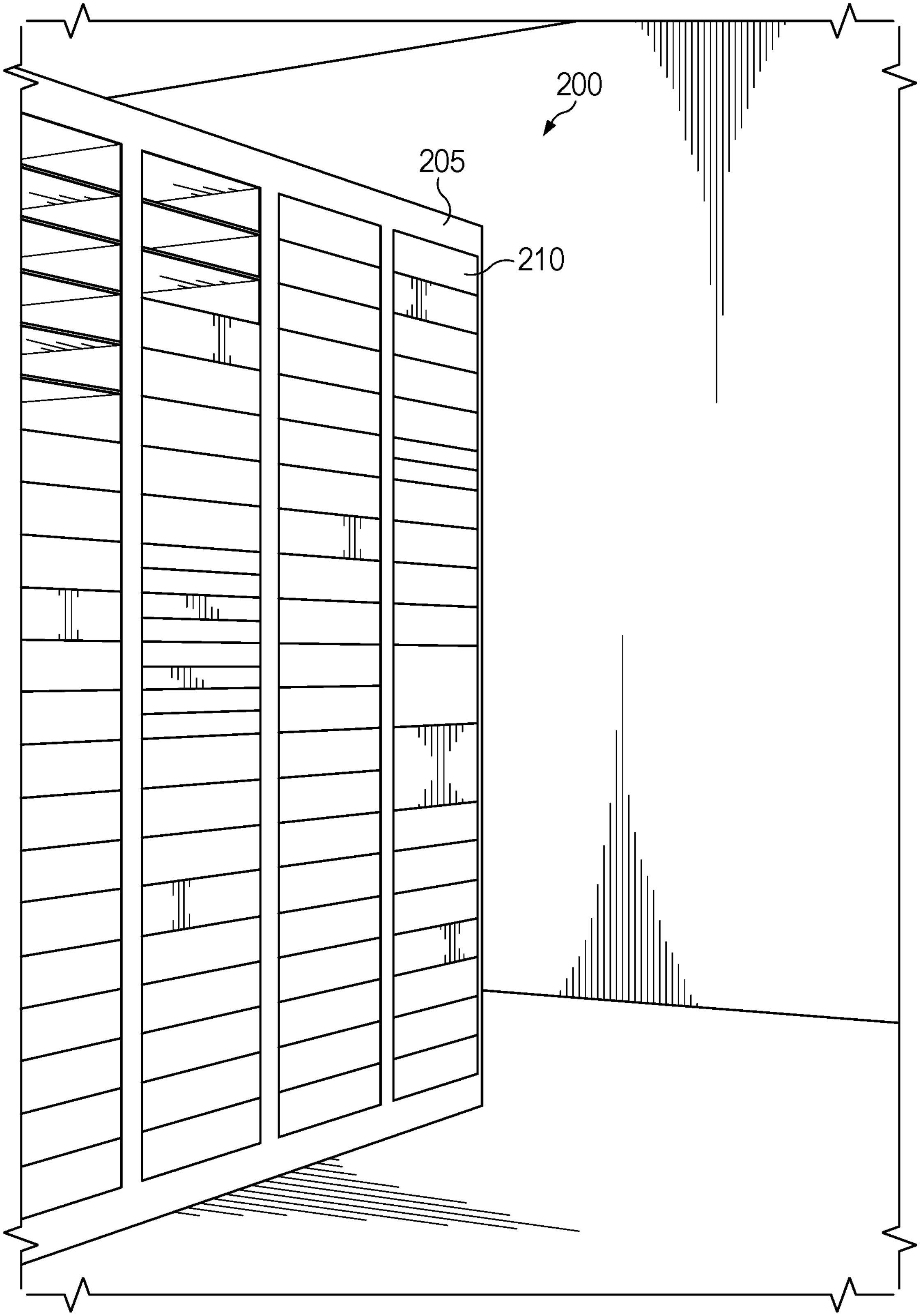
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuously with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

Figure 3:
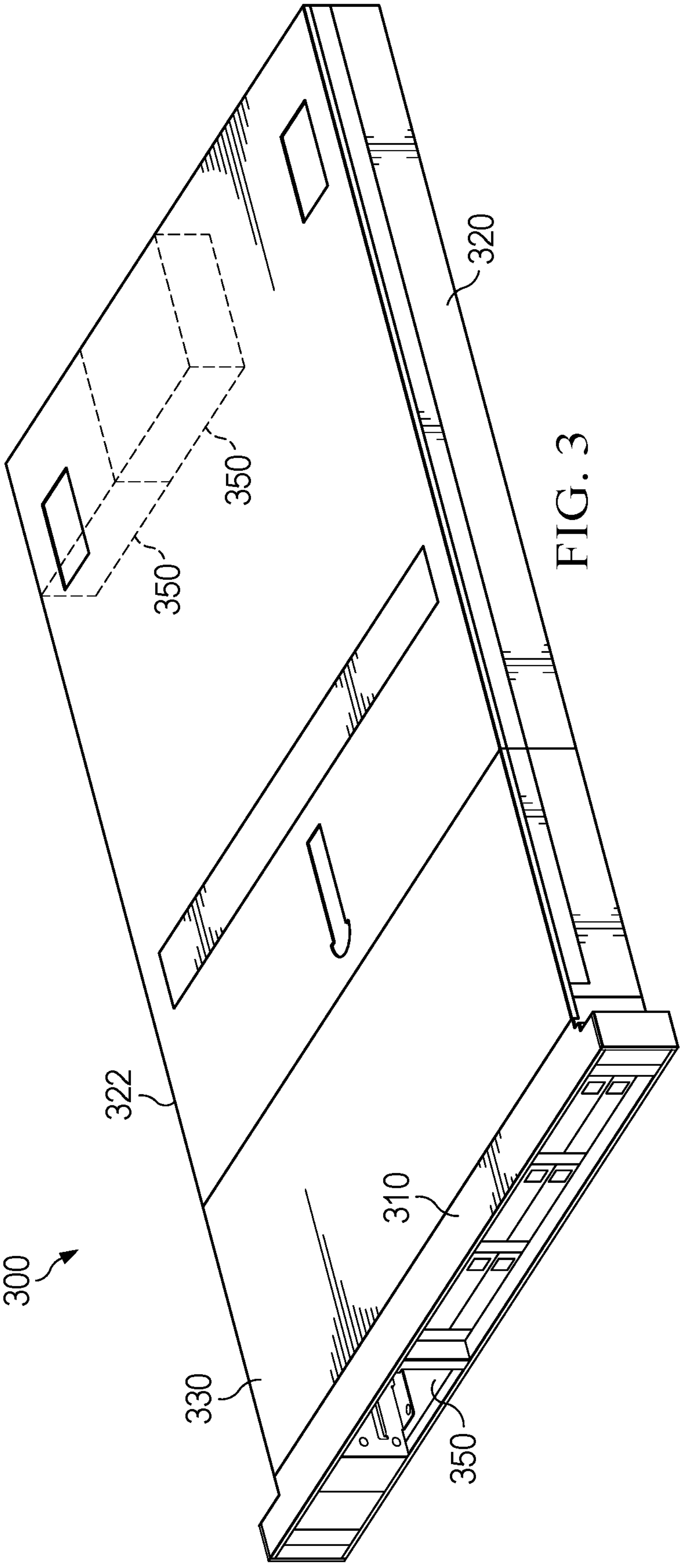
FIG. 3 shows a generalized perspective view of an example server type information handling system.

FIG. 3 shows a generalized perspective view of an example server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the server type information handling system 300 may be accessed by removing a top panel 330 of the server type information handing system 300. In certain embodiments, the server type information handing system 300 includes one or more front bays 350 via which components may be mounted to the server type information handling system. In certain embodiments, the server type information handing system 300 includes one or more rear bays 352 via which components may be mounted to the server type information handling system. In certain embodiments, the front bays 350, the rear bays 352, or a combination thereof, includes respective device bay retentions systems (such as device bay retention system 150).

Figure 4:
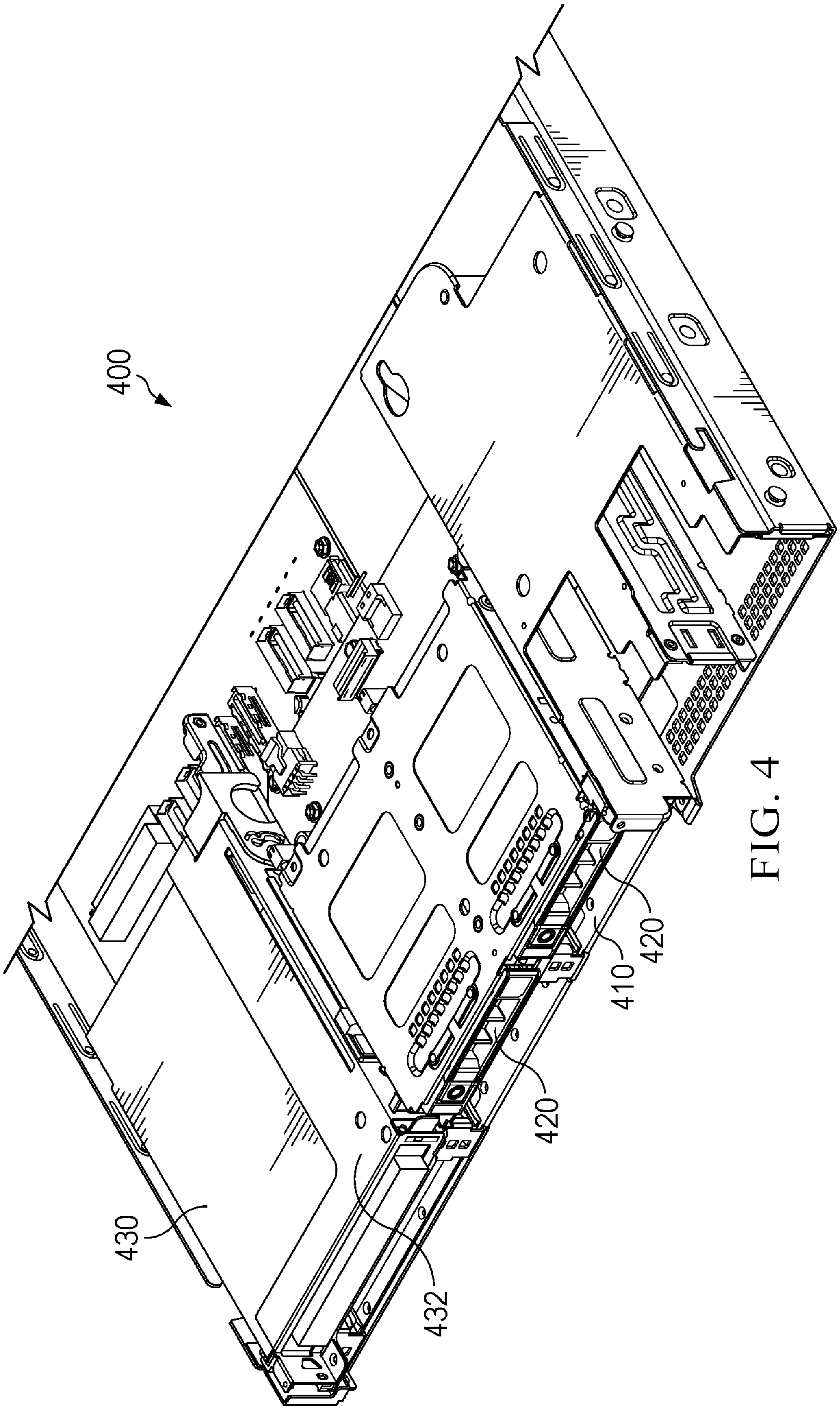
FIG. 4 shows a perspective view of a rear portion of server type information handling system with riser retention bracket system.

FIG. 4 shows a perspective view of a rear portion 400 of server type information handling system with riser retention bracket system 410. In certain embodiments, the riser retention bracket system 410 allows a plurality of mounting points for rear accessible modules 420, 430 such as drivers which are mounted in respective rear drive bays. In certain embodiments the rear accessible modules include low profile rear accessible modules 420, full height rear accessible module 430, or a combination thereof. In certain embodiments, mounting points for various combinations of low profile rear accessible modules 420 and full height rear accessible module 430 are provided by the riser retention bracket system 410. In certain embodiments, a full height rear accessible module 430 can have an associated top bracket 432. In certain embodiments, mounting points for the associated top bracket 432 are provided by the riser retention bracket system 410.

Such a riser retention bracket system 410 provides an ability to laterally move risers sideways (e.g., left or right) and still have the risers couple with (i.e., grasp) the bracket itself. This ability is especially valuable with floating riser type bays. Various aspects of the present disclosure include an appreciation that floating riser type bays can address increasing signal integrity requirements for higher speed devices. Various aspects of the present disclosure include an appreciation that many known riser retention designs use a hole and hardware in the printed circuit board for a retention function. The present riser retention bracket system allows the riser assembly to shift left or right, because the riser is grasping a shelf, instead of a piece of hardware through a board hole. Accordingly, the present riser retention bracket abstracts riser positioning when compared with known board holes type implementations.

Figure 5:
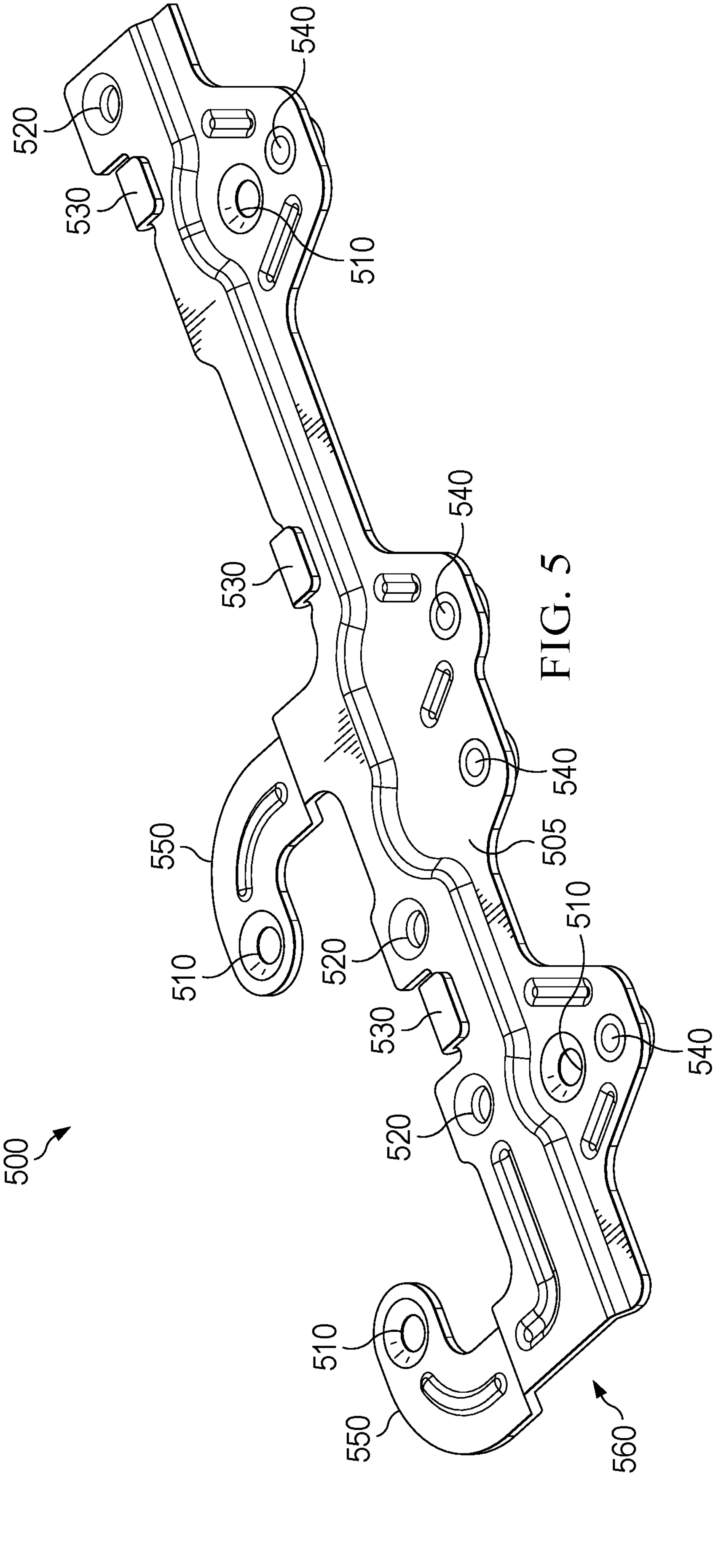
FIG. 5 shows a perspective view of a riser retention bracket.
Figure 6:
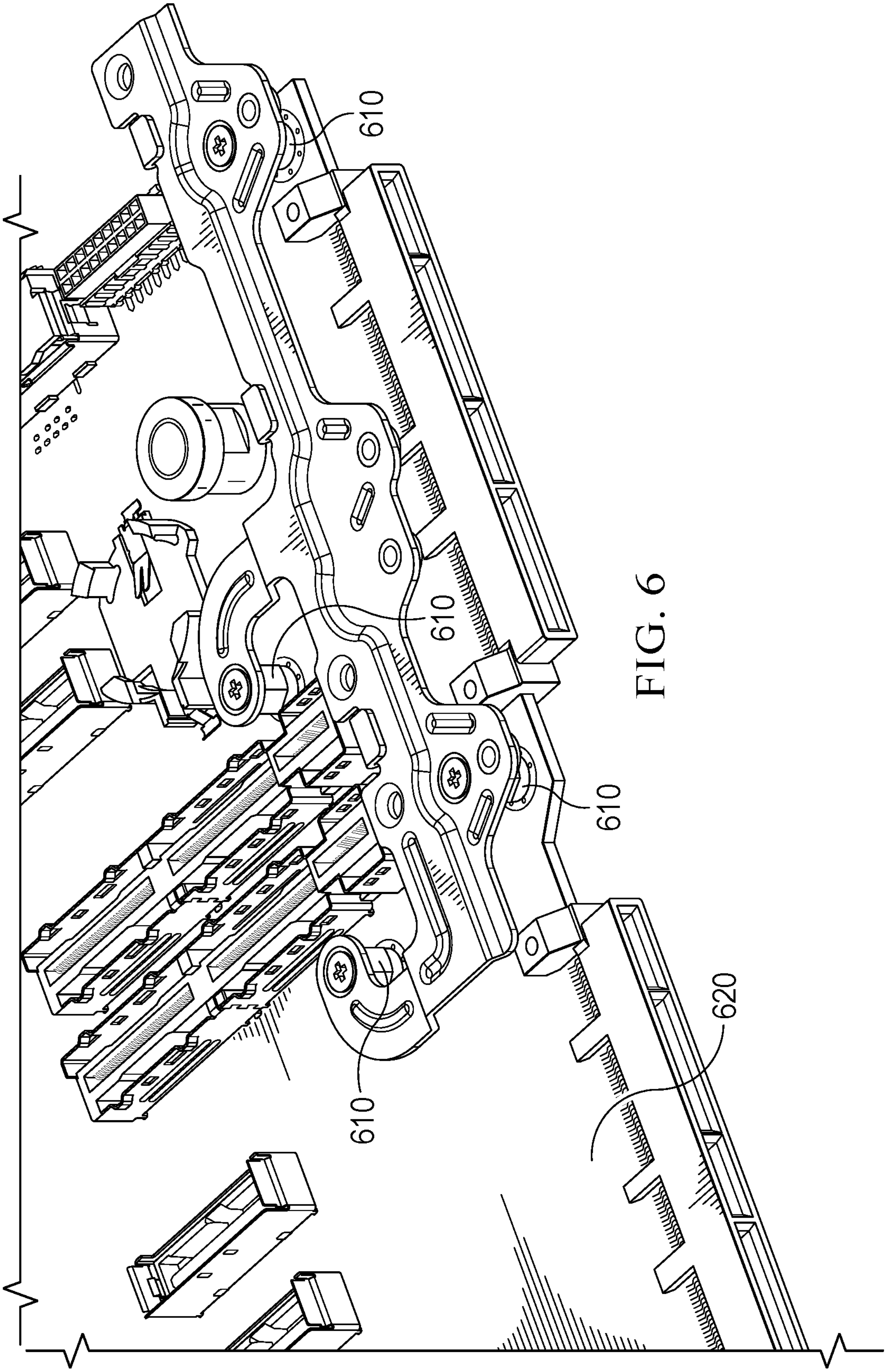
FIG. 6 shows a perspective view of a riser retention bracket mounted within a server type information handling system.

FIG. 5 shows a perspective view of a riser retention bracket 500. FIG. 6 shows a perspective view of a riser retention bracket 500 mounted within a rear portion 600 of a server type information handling system.

More specifically, the riser retention bracket 500 is configured as an integrated lateral riser retention bracket component 505. In certain embodiments, the riser retention bracket component 505 defines one or more riser cage stand off apertures 510, one or more guide apertures 520, one or more peripheral module mounting apertures 540, or a combination thereof. In certain embodiments, the riser retention bracket component 505 includes one or more retention tabs 530. In certain embodiments, each of the one or more retention tabs 530 is positioned relative to a side edge of a drive bay mounting location.

In certain embodiments, a top portion of each cage stand off aperture is tapered such that when a cage stand off is attached to a cage stand off, the fastener is flush with the top of the riser retention bracket 500. In certain embodiments, the guide apertures 520 provide respective guide holes to allow locating the riser cage via respective alignment pins relative to the riser connector on the host processor module. In certain embodiments, a top portion of each guide aperture 520 is tapered to assist in centering an alignment pin as the pin is mated with the guide aperture. In certain embodiments, the peripheral module mounting apertures 540 include threaded holes for mounting and retaining rear peripheral modules such as rear accessible drive bays.

In certain embodiments, certain riser cage stand off apertures 510 are located on respective curved arms 550 of the riser retention bracket. In certain embodiments, each curved arm 550 is arc shaped. By being so located, the riser cage stand off apertures have additional distance from a main body of the riser retention bracket while allowing access to components located below the riser retention bracket when the bracket is mounted within a rear portion of an information handling system chassis. In certain embodiments, the components to which the curved arms 550 provide access include HPM connectors.

In certain embodiments, the lateral portion of the riser retention bracket 500 includes a raised portion 560. In certain embodiments, the raised portion 560 extends laterally across the riser retention bracket 500. In certain embodiments, the raised portion 530 includes one or more guide apertures 520, one or more retention tabs 530, or a combination thereof. In certain embodiments, the raised portion 560 provides support for modules, such as full height modules, mounted to the riser retention bracket 500.

In certain embodiments, the riser retention bracket 500 allows retention of a riser cage within M-DNO HPM constraints. In certain embodiments, the riser retention bracket 500 mounts directly to the host processor module 620 (also referred to as a planar or planar board) through the riser cage stand off apertures 510 using standoffs 610. By using the standoffs 610, the riser retention bracket 500 is vertically separated from the underlying host processor module 620. By providing such a vertical separation, peripheral modules which are mounted to the riser retention bracket effectively float above the planar board 620. In certain embodiments, the riser retention bracket 500 and mounting configuration allow for use of a rotating lever to ensure a riser cage edge is fully inserted into a riser connector on the HPM. Such a riser retention bracket and mounting configuration provides retention during shock events, such as when the information handling system is in transit.

Figure 7A:
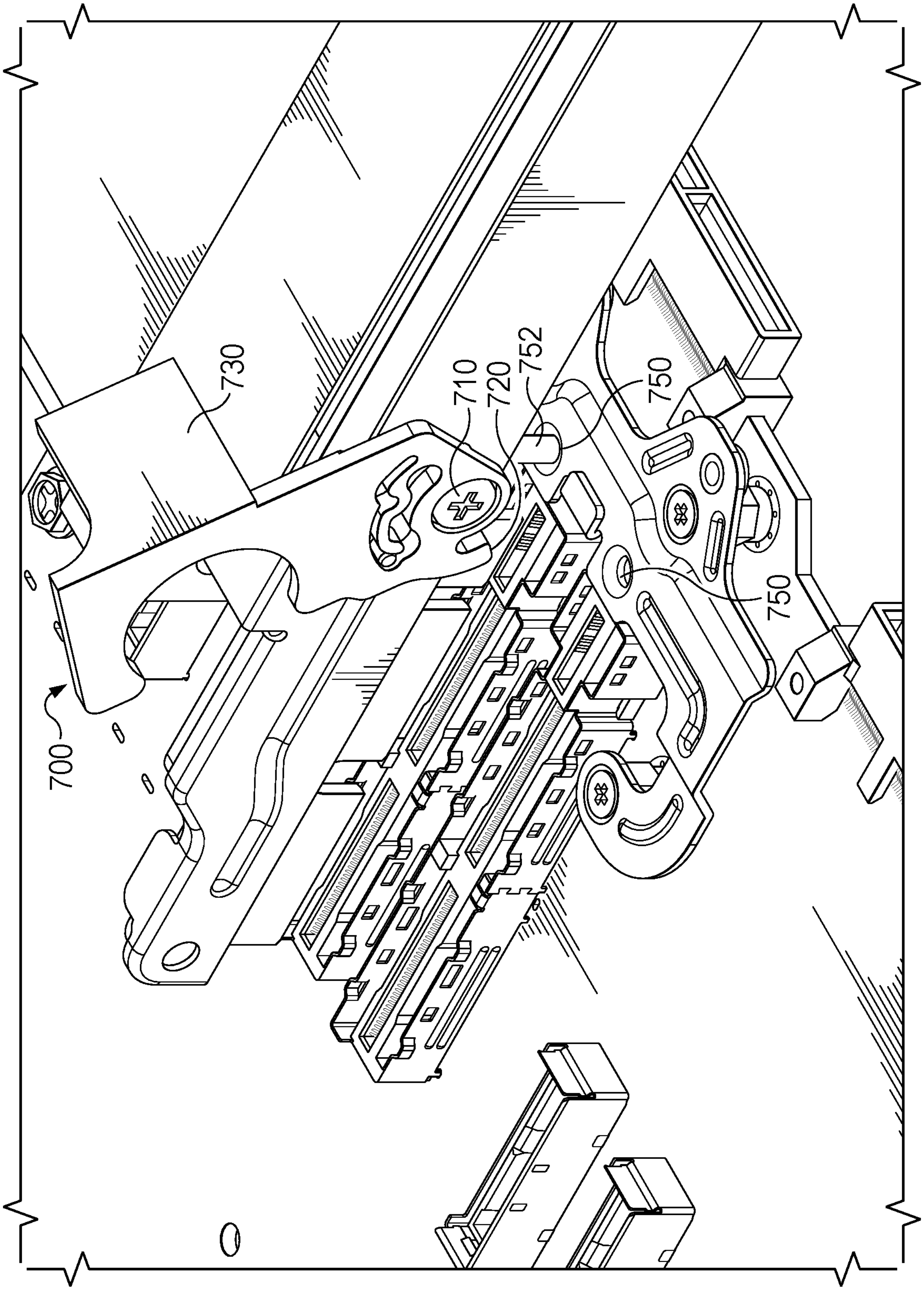
FIGS. 7A and 7B, generally referred to as FIG. 7, show respective perspective views of a rotating lever of a riser retention bracket system in an open orientation and a closed orientation.
Figure 7B:
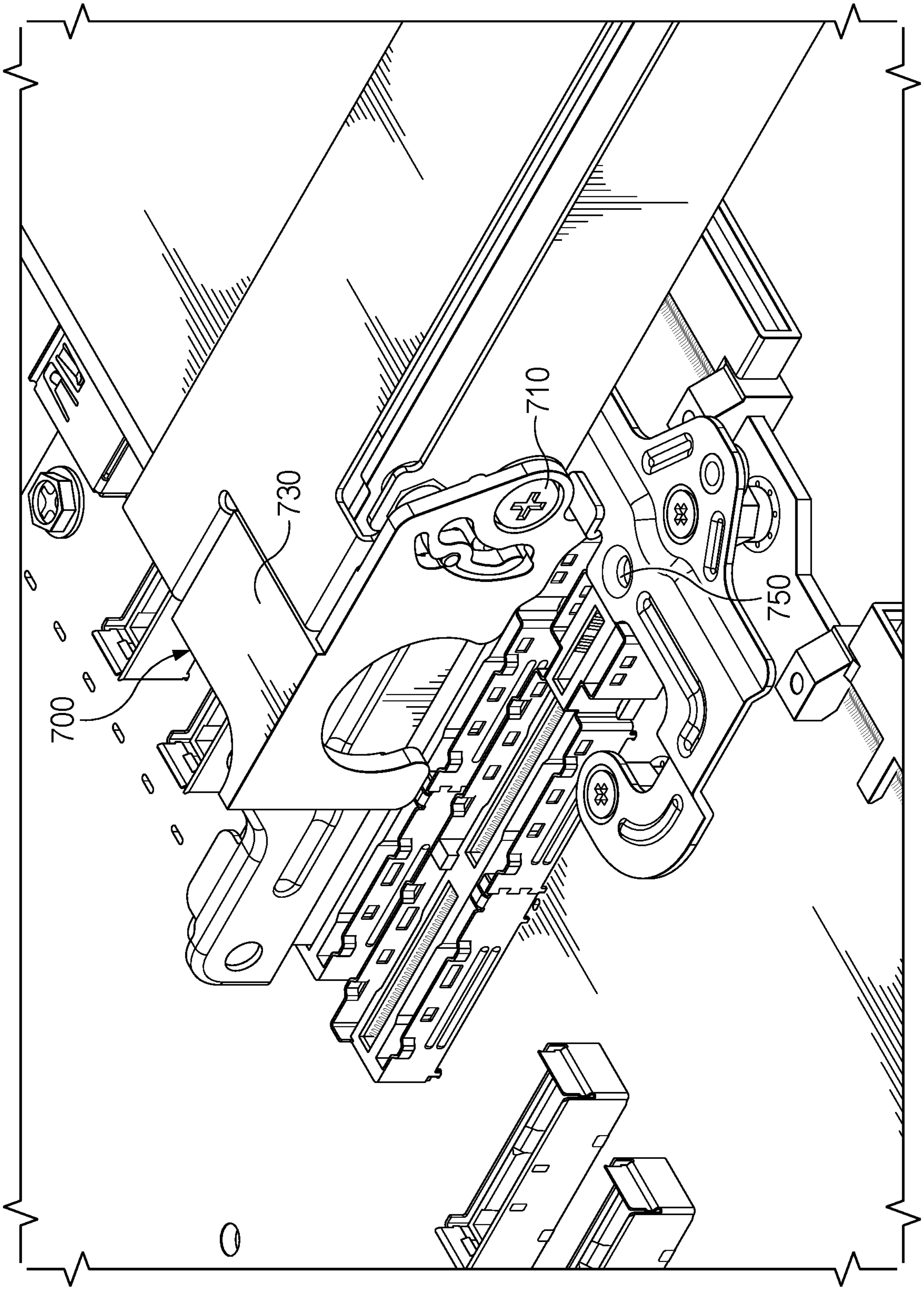
Figure 7C:
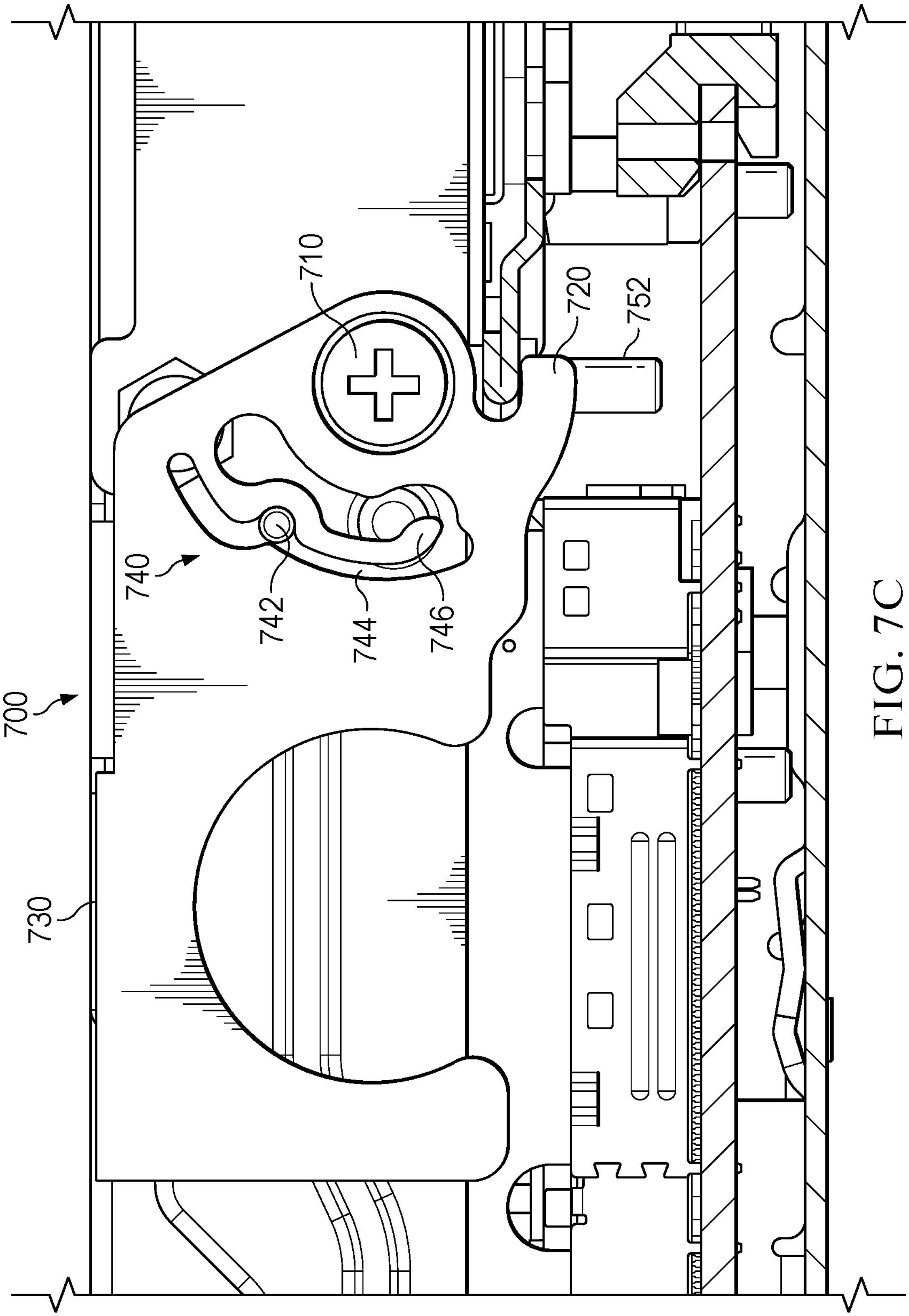
FIG. 7C, generally referred to as FIG. 7, shows a side view of a rotating lever of a riser retention bracket system in a closed orientation.

FIGS. 7A and 7B, generally referred to as FIG. 7, show respective perspective views of a rotating lever component 700 of a riser retention bracket system in an open orientation and a closed orientation. FIG. 7C, generally referred to as FIG. 7, shows a side view of a rotating lever component 700 of a riser retention bracket system in a closed orientation.

In certain embodiments, the rotating lever component 700 includes a pivot point 710, a lever hook 720, a top lever portion 730 and a detent portion 740. In certain embodiments, the detent portion 740 mates with a detent projection 742 of a peripheral tray. In certain embodiments, the detent portion 740 includes a detent channel 744 via which the dent projection moves from an open orientation to a closed orientation when the rotating lever component 700 is moved from an open orientation to a closed orientation. In certain embodiments, the detent portion 740 provides a detent function when the rotating lever component 700 is in the open orientation.

In certain embodiments, the rotating lever component 700 prevents a riser card edge disengaging from a riser connector during shock events. In certain embodiments, the lever hook 720 of the rotating lever component is positioned very close to the bottom, center of the pivot. In certain embodiments, the lever hook 720 engages a retention tab of the riser retention bracket when the rotating lever component 700 is in the closed orientation. The top lever portion 730 of the lever is very near the inside surface of the top cover and helps maintains the closed position of the lever when the top cover of the server chassis is present.

In certain embodiments, to prevent the board card edge of the riser from disengaging from the riser connector during shock events, the lever hook 720 is positioned very close (i.e., within 5 cm (+/−20%)) to the bottom, center of the pivot point 710. In certain embodiments, the top lever portion 730 includes a tab which extends substantially perpendicularly (+/−20%)) from a vertical portion of the rotating lever component 700. In certain embodiments, the tab is very near (i.e., within 2 cm (+/−20%)) an inside surface of a top cover of an information handling system chassis. By being so located, this tab helps maintain the closed position of the lever when the top cover of the information handling system chassis is present.

Figure 8A:
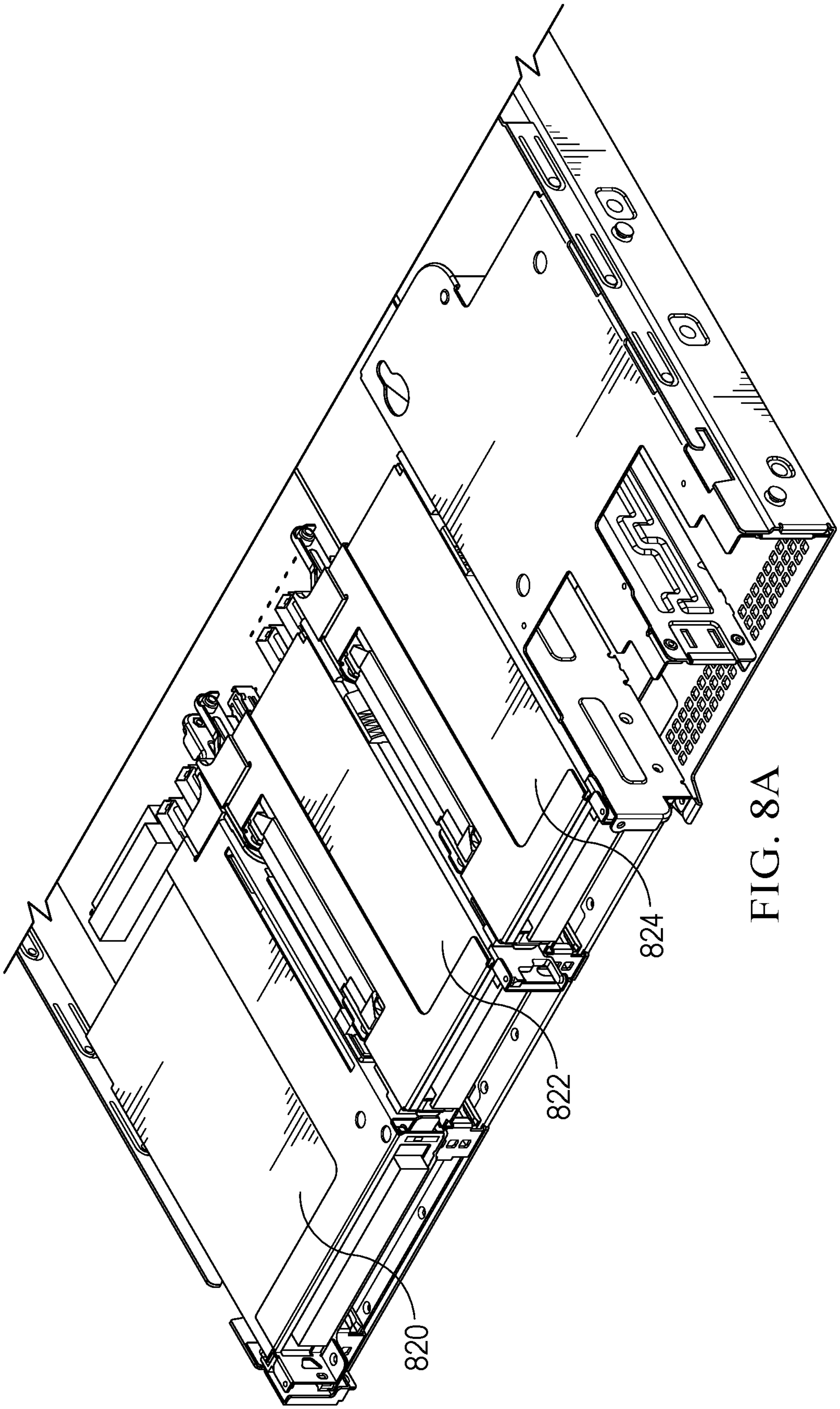
FIGS. 8A, 8B and 8C, generally referred to as FIG. 8, show perspective views of a plurality of device mounting options available when used with a riser retention bracket system
Figure 8B:
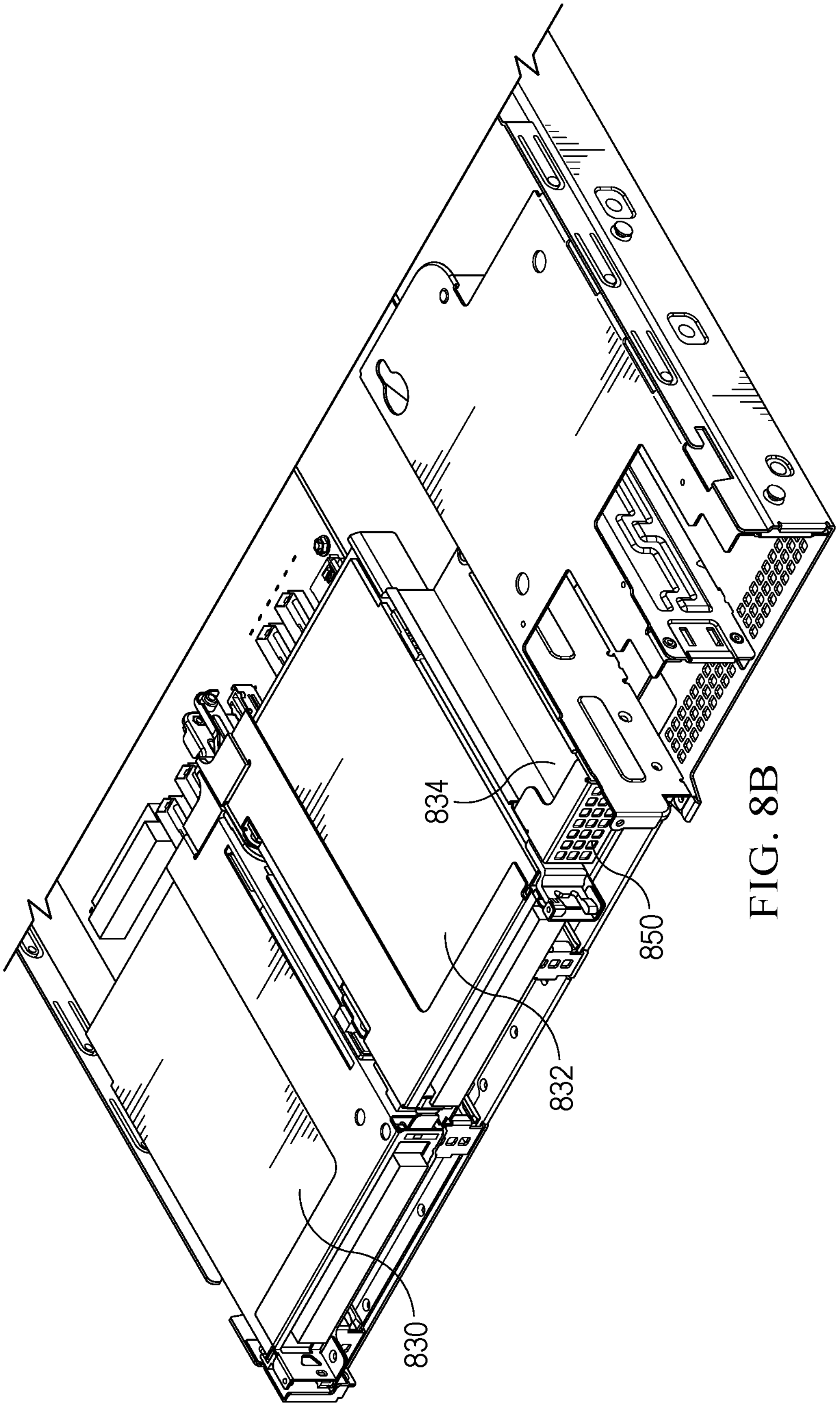
Figure 8C:
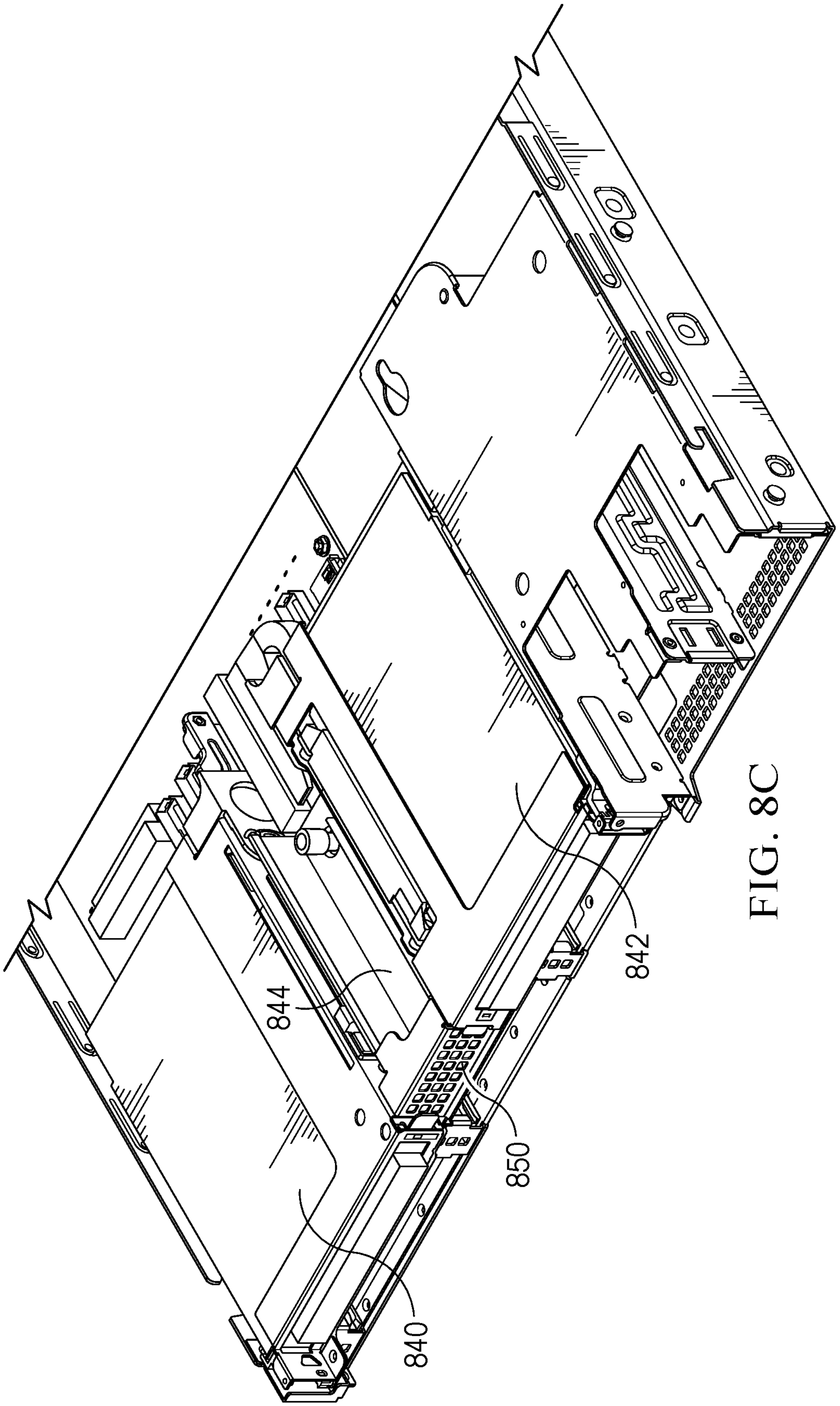

FIGS. 8A, 8B and 8C, generally referred to as FIG. 8, show perspective views of a plurality of device mounting options available when used with a riser retention bracket system. More specifically, FIG. 8A shows a device mounting option which includes one full height riser cage 810 and two low profile riser cages 820, 822. FIG. 8B shows a device mounting option which includes two full height riser cages 830, 832 and a blank riser cage 834. FIG. 8C shows a device mounting option which includes two full height riser cages 840, 842 and a center blank riser cage 846. In certain embodiments, the blank riser cages 834, 846 include a rear air flow portion 850 which enhance air flow within the information handling system in which the blank riser cage is installed.

Such a riser retention bracket advantageously allows a plurality of mounting points for rear drive bays or similar rear accessible modules along with allowing rear blank bay areas. In certain embodiments, the bracket of the riser retention system is mounted directly to the planar of the server type information handling system for securing devices within device bays such as PCIe riser cages and externally mounted drive bays or other rear accessible modules with minimal impact on the board area of the planar board. Such a riser retention system enhances design flexibly by providing latching or mounting points in areas of the server type information handling system without compromising design or integrity of the server type information handling system.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A riser retention bracket for an information handling system, comprising:

a lateral riser retention bracket component; the lateral riser retention bracket component comprising a horizontal main housing portion, the lateral riser bracket component defining a plurality of riser cage stand off apertures, the plurality of riser cage stand off apertures being positioned to mate with respective riser cage stand offs of a plurality of riser cage stand offs when the lateral riser retention bracket component is horizontally mounted within the information handling system; wherein, the lateral riser retention bracket includes a curved arm portion, the curved arm portion extending horizontally from the horizontal main housing portion of the lateral riser retention bracket, at least one of the plurality of riser cage stand off apertures being located on the curved arm portion.

2. The riser retention bracket of claim 1, wherein:

the lateral riser retention bracket defines a plurality of guide apertures.

3. The riser retention bracket of claim 1, wherein:

the lateral riser retention bracket defines a plurality of peripheral module mounting apertures.

4. The riser retention bracket of claim 1, wherein:

the lateral riser retention bracket includes a plurality of retention tabs, each of the plurality of retention tabs being positioned relative to a side edge of a drive bay mounting location.

5. The riser retention bracket of claim 4, wherein:

each of the plurality of retention tabs are configured to mate with a rotating lever component when the rotating lever component is in a closed orientation.

6. A drive mounting system for an information handling system comprising:

a rotating lever component; and, a riser retention bracket, the riser retention bracket comprising:

a lateral riser retention bracket component; the lateral riser retention bracket component comprising a horizontal main housing portion, the lateral riser bracket component defining a plurality of riser cage stand off apertures, the plurality of riser cage stand off apertures being positioned to mate with respective riser cage stand offs of a plurality of riser cage stand offs when the lateral riser retention bracket component is horizontally mounted within the information handling system; wherein, the lateral riser retention bracket includes a curved arm portion, the curved arm portion extending horizontally from the horizontal main housing portion of the lateral riser retention bracket, at least one of the plurality of riser cage stand off apertures being located on the curved arm portion.

7. The drive mounting system of claim 6, wherein:

the lateral riser retention bracket defines a plurality of guide apertures.

8. The drive mounting system of claim 6, wherein:

the lateral riser retention bracket defines a plurality of peripheral module mounting apertures.

9. The drive mounting system of claim 6, further comprising:

the lateral riser retention bracket includes a plurality of retention tabs, each of the plurality of retention tabs being positioned relative to a side edge of a drive bay mounting location.

10. The drive mounting system of claim 9, wherein:

each of the plurality of retention tabs are configured to mate with the rotating lever component when the rotating lever component is in a closed orientation.

11. An information handling system comprising:

a processor;

a data bus coupled to the processor;

drive mounting system comprising:

a rotating lever component; and, a lateral riser retention bracket component; the lateral riser retention bracket component comprising a horizontal main housing portion, the lateral riser bracket component defining a plurality of riser cage stand off apertures, the plurality of riser cage stand off apertures being positioned to mate with respective riser cage stand offs of a plurality of riser cage stand offs when the lateral riser retention bracket component is horizontally mounted within the information handling system; wherein, the lateral riser retention bracket includes a curved arm portion, the curved arm portion extending horizontally from the horizontal main housing portion of the lateral riser retention bracket, at least one of the plurality of riser cage stand off apertures being located on the curved arm portion.

12. The information handling system of claim 11, wherein:

the lateral riser retention bracket defines a plurality of guide apertures.

13. The information handling system of claim 11, wherein:

the lateral riser retention bracket defines a plurality of peripheral module mounting apertures.

14. The information handling system of claim 11, wherein:

the lateral riser retention bracket includes a plurality of retention tabs, each of the plurality of retention tabs being positioned relative to a side edge of a drive bay mounting location.

15. The information handling system of claim 14, wherein:

each of the plurality of retention tabs are configured to mate with the rotating lever component when the rotating lever component is in a closed orientation.

* * * * *